United States Patent
Ogawa

(10) Patent No.: US 10,249,374 B2
(45) Date of Patent: Apr. 2, 2019

(54) VOLTAGE SUPPLY CIRCUIT AND SEMICONDUCTOR STORAGE DEVICE

(71) Applicant: LAPIS Semiconductor Co., Ltd., Yokohama (JP)

(72) Inventor: Junya Ogawa, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/623,759

(22) Filed: Jun. 15, 2017

(65) Prior Publication Data

US 2017/0372788 A1 Dec. 28, 2017

(30) Foreign Application Priority Data

Jun. 24, 2016 (JP) .................................. 2016-125270

(51) Int. Cl.
*G11C 7/00* (2006.01)
*G11C 16/30* (2006.01)

(52) U.S. Cl.
CPC .................... *G11C 16/30* (2013.01)

(58) Field of Classification Search
CPC ...................................................... G11C 16/30
USPC ......................................................... 365/226
See application file for complete search history.

(56) References Cited

U.S. PATENT DOCUMENTS

| | | | |
|---|---|---|---|
| 2007/0153589 A1* | 7/2007 | Tailliet | H02M 3/073 365/189.06 |
| 2008/0056031 A1* | 3/2008 | Takahashi | G11C 5/145 365/194 |
| 2012/0262225 A1* | 10/2012 | Nakamura | H02M 3/073 327/536 |
| 2014/0103982 A1* | 4/2014 | Lin | H03K 5/153 327/180 |
| 2014/0375369 A1* | 12/2014 | Hayashi | G11C 5/145 327/306 |

FOREIGN PATENT DOCUMENTS

JP 2008-305467 A 12/2008

* cited by examiner

*Primary Examiner* — Hoai V Ho
(74) *Attorney, Agent, or Firm* — Rabin & Berdo, P.C.

(57) ABSTRACT

A voltage supply circuit includes a step-down circuit configured to receive a power supply voltage, step down the power supply voltage to generate a step-down voltage having a constant value lower than a value of the power supply voltage, and a booster circuit configured to boost the step-down voltage to generate an output voltage, the output voltage having a value greater than the value of the power supply voltage.

11 Claims, 8 Drawing Sheets

VOLTAGE SUPPLY CIRCUIT AND SEMICONDUCTOR STORAGE DEVICE

BACKGROUND OF THE INVENTION

Technical Field

The present invention relates to a voltage supply circuit including a booster circuit that boosts the power supply voltage and to a semiconductor storage device.

Background Art

A semiconductor storage device such as a NAND flash memory uses a voltage higher than the power supply voltage supplied from outside in order to write, delete, and read data. Thus, the semiconductor storage device is provided with a voltage supply circuit having a booster circuit that boosts the power supply voltage (see Japanese Patent Application Laid-Open Publication No. 2008-305467, for example). The booster circuit includes a plurality of metal-oxide semiconductor (MOS) transistors that are in a cascade arrangement, and a plurality of capacitors, each having a first terminal connected to a connection node (drain terminal or source terminal) between the transistors. Of the plurality of transistors in a cascade arrangement, the source terminal of the initial stage transistor has applied thereto a power supply voltage, and the second terminal of each capacitor has supplied thereto a clock signal (or a reversed signal to the clock signal). By such a configuration, in the booster circuit, each capacitor is charged according to the clock signal and this voltage is applied to the connection node between the transistors, thereby boosting the voltage of the connection node. As a result, a voltage higher than the voltage supplied to the connection node of a previous stage transistor is supplied to the next stage transistor. By this operation, a voltage that has been boosted to a value greater than the power supply voltage is outputted from the final stage transistor.

SUMMARY OF THE INVENTION

In a NAND flash memory, a write voltage for writing data on the basis of the voltage boosted by such a booster circuit is generated and the write voltage is applied to a memory cell to which the data is to be written, and as a result, the data is written. However, due to variation and the like in manufacturing, the voltage value suitable for writing differs for each memory cell. In order to reliably write data to each memory cell having differing voltage values suitable for writing, in NAND flash memories, the value of the write voltage is incrementally increased and data is written by a write voltage having a value that differs for each incremental stage.

However, the voltage generated by such a booster circuit has so-called ripples in which the voltage value oscillates in the vicinity of the set voltage.

If the amplitude of the ripple generated in the write voltage is high, it becomes difficult to increase the value of the write voltage by a prescribed voltage value, and there was a risk that data writing could not be performed normally.

An object of the present invention is to provide a voltage supply circuit by which a voltage with suppressed ripple amplitude can be generated, and a semiconductor storage device including the voltage supply circuit.

According to an aspect of the invention, there is provided a voltage supply circuit, including a step-down circuit configured to receive a power supply voltage, step down the power supply voltage to generate a step-down voltage having a constant value lower than a value of the power supply voltage, and a booster circuit configured to boost the step-down voltage to generate an output voltage, the output voltage having a value greater than the value of the power supply voltage.

According to an aspect of the invention, there is provided a semiconductor storage device, including a memory cell array including a plurality of memory cells, a memory driving unit configured to supply a voltage for writing to the memory cell array in a writing period, and a voltage supply circuit configured to generate the voltage for writing from a power supply voltage and supply the voltage for writing to the memory driving unit. The voltage supply circuit includes a step-down circuit configured to receive the power supply voltage, step down the power supply voltage to generate a step-down voltage having a constant value lower than a value of the power supply voltage, and a booster circuit configured to boost the step-down voltage to generate the voltage for writing, the voltage for writing having a value greater than the value of the power supply voltage.

In the present invention, when generating a voltage with a higher value than the power supply voltage supplied from outside, the step-down circuit temporarily steps down the power supply voltage to generate a step-down voltage having a constant value lower than the value of the power supply voltage. The booster circuit attains an output voltage having a prescribed set voltage that is higher than the value of the power supply voltage by boosting the step-down voltage.

By this configuration, the booster circuit boosts the step-down voltage having a lower value than the power supply voltage, and thus, compared to a case in which the power supply voltage itself is boosted, the output current corresponding to the output voltage is less. As a result, the amplitude of ripples in the output voltage, which is greater the higher the output current is, is suppressed.

In the booster circuit, the output current becomes greater as the voltage being boosted increases, and the amplitude of ripples occurring in the output voltage proportionally increases. In the booster circuit of the present invention, as described above, the step-down voltage, which has a constant voltage that is lower than the power supply voltage and that is not dependent on the power supply voltage, is boosted. Thus, even if the power supply voltage is high, it is possible to keep the output current at a constant low value corresponding to the output voltage.

Thus, according to the present invention, it is possible to generate a voltage in which the amplitude of ripples is suppressed without being dependent on the value of the power supply voltage.

DETAILED DESCRIPTION OF EMBODIMENTS

An embodiment of the present invention will be explained in detail below with reference to the drawings.

Figure 1:
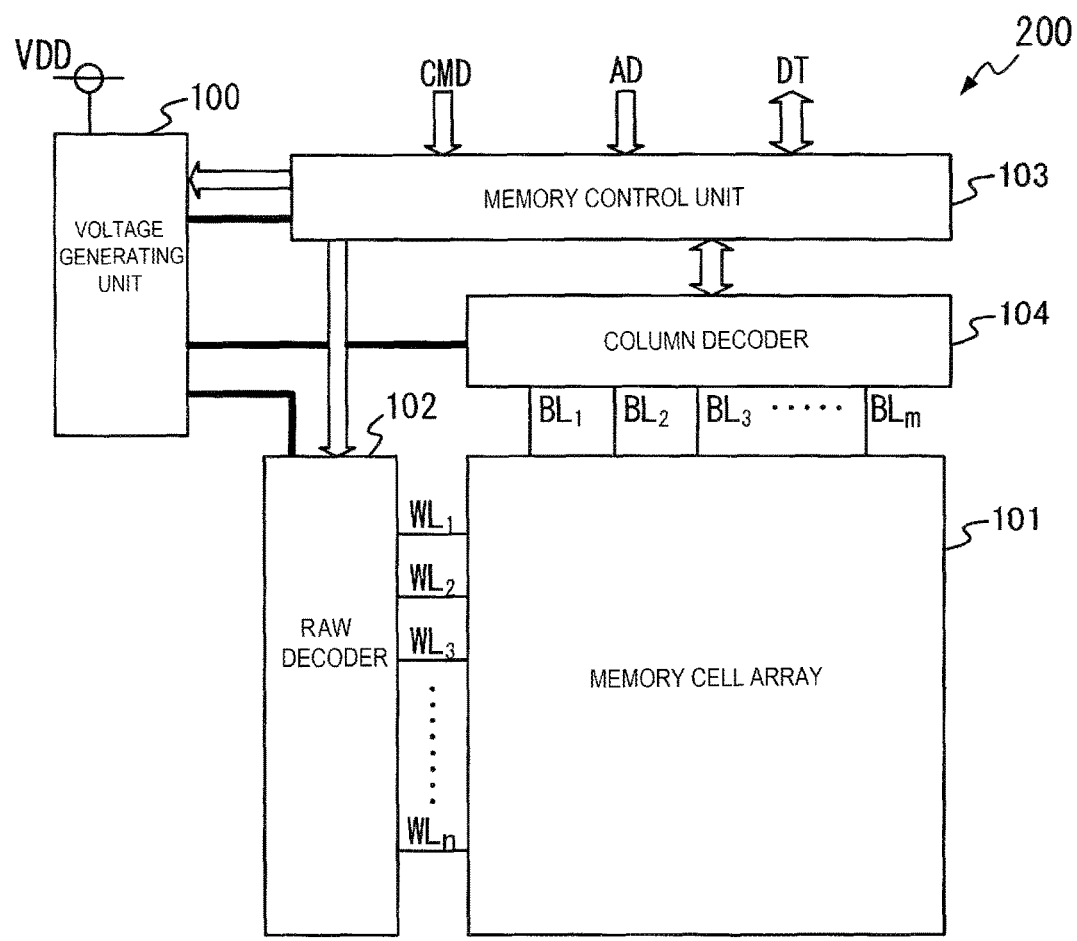
FIG. 1 is a block diagram showing an example of a schematic configuration of a semiconductor storage device 200 including a voltage supply circuit according to the present invention.

FIG. 1 is a block diagram showing an example of a schematic configuration of a semiconductor storage device 200 including a voltage supply circuit according to the present invention. The semiconductor storage device 200 is a NAND flash memory, for example, and in addition to a voltage generating unit 100 and a memory cell array 101, has a memory driving unit constituted of a row decoder 102, a memory control unit 103, and a column decoder 104.

The memory cell array 101 includes a plurality of bit lines $BL_1$ to BLm (m being an integer of 2 or greater) arranged in the column direction), and a plurality of word lines $WL_1$ to WLn (n being an integer of 2 or greater) that intersect the bit lines $BL_1$ to BLm and that are arranged in the row direction, and a memory cell (not shown) is formed at each intersection of the bit line BL and the word line WL. Reading and writing of binary or multiple-base data is performed in each memory cell according to a selection voltage supplied through the word line WL and a read voltage or write voltage supplied through a pair of bit lines BL.

The row decoder 102 applies a selection voltage to the word lines $WL_1$ to WLn of the memory cell array 101 according to a control signal supplied from the memory control unit 103.

The column decoder 104 applies ground potential, a read voltage, or a write voltage to the bit lines $BL_1$ to BLm of the memory cell array 101 according to a control signal supplied from the memory control unit 103.

The memory control unit 103 supplies to the row decoder 102 and the column decoder 104 various control signals to read, write, or delete data according to various memory control signals (chip enable signal, write enable signal, read enable signal, address latch enable signal, command latch enable signal, etc.) supplied from outside. Here, when reading data, the memory control unit 103 supplies to the row decoder 102 a control signal indicating that a selection voltage will be applied to the word line WL corresponding to the address indicated by the address AD. Additionally, during this time, the memory control unit 103 supplies to the column decoder 104 a control signal indicating that ground potential or a read voltage will be applied to the bit lines $BL_1$ to BLm (read control operation). By this read control operation, the memory cell sends a current based on the charge stored in the memory cell to the bit line BL. At this time, the column decoder 104 supplies to the memory control unit 103 a read current value representing the value of the current sent through the bit line BL. The memory control unit 103 determines the value of the data on the basis of the read current value, and outputs reading data indicating this value as data DT.

Also, the memory control unit 103 supplies to the voltage generating unit 100 a boost control signal S at a logic level of 1 to execute a boosting operation when writing data. The memory control unit 103 performs the following verify write control operation according to the write data supplied as the data DT.

That is, the memory control unit 103 supplies to the row decoder 102 a control signal indicating that a selection voltage will be applied to the word line WL corresponding to the address indicated by the address AD. During this time, the memory control unit 103 generates a write control signal indicating that a write voltage will be applied repeatedly to one address indicated by the address AD, supplies this write control signal to the column decoder 104, and repeatedly executes the aforementioned read control operation. Additionally, at this time, the memory control unit 103 supplies to the voltage generating unit 100 a voltage adjustment signal CV indicating that the value of the write voltage is to be increased gradually.

By this verify write control operation, the column decoder 104 applies repeatedly and discontinuously a write voltage that increases over time to each memory cell through the bit lines BL. Thus, a charge is injected to each memory cell every time the write voltage is applied, and the charge gradually accumulates therein. At this time, by the read control operation, the column decoder 104 supplies to the memory control unit 103 a read current value sent from the memory cell. The memory control unit 103 determines whether or not the read current value has reached a value corresponding to the writing data, and if the read current value reaches the value corresponding to the writing data, supply of the writing control signal to the column decoder 104 is stopped.

The voltage generating unit 100 generates a logic power supply voltage for operating the memory control unit 103 on the basis of the power supply voltage VDD supplied from an external power source (not shown), and supplies this logic power supply voltage to the memory control unit 103.

The voltage generating unit 100 generates a selection voltage, a delete voltage, and a read voltage for reading or deleting data from the memory cell on the basis of the power supply voltage VDD. The voltage generating unit 100 supplies the selection voltage to the row decoder 102 and supplies the delete voltage and the read voltage to the column decoder 104.

Furthermore, the voltage generating unit 100 generates a write voltage having a value higher than the power supply voltage VDD on the basis of the power supply voltage VDD and supplies this write voltage to the column decoder 104.

Figure 2:
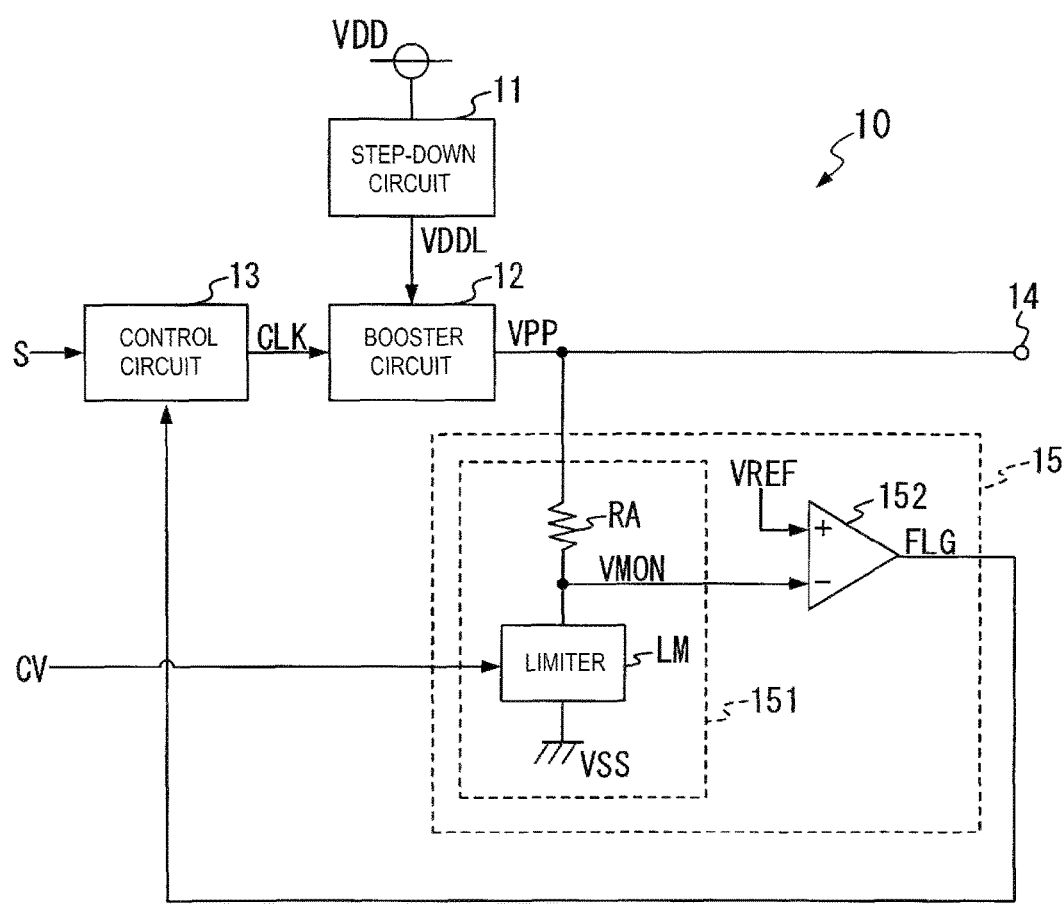
FIG. 2 is a circuit diagram showing a configuration of a voltage supply circuit 10.

FIG. 2 is a circuit diagram showing the configuration of a voltage supply circuit 10 that is included in the voltage generating unit 100, and that generates an output voltage VPP as a write voltage by boosting the power supply voltage VDD.

As shown in FIG. 2, the voltage supply circuit 10 has a step-down circuit 11, a booster circuit 12, a control circuit 13, an output terminal 14, and a voltage detection circuit 15.

The step-down circuit 11 generates a step-down voltage VDDL that is stepped down from the power supply voltage VDD and supplies this step-down voltage to the booster circuit 12. The power supply voltage VDD has a value within a voltage range from a prescribed minimum voltage value to a prescribed maximum voltage value. The step-down voltage VDDL is a constant voltage having a minimum voltage value within a voltage range that can be acquired as the value of the power supply voltage VDD, for example.

Figure 3:
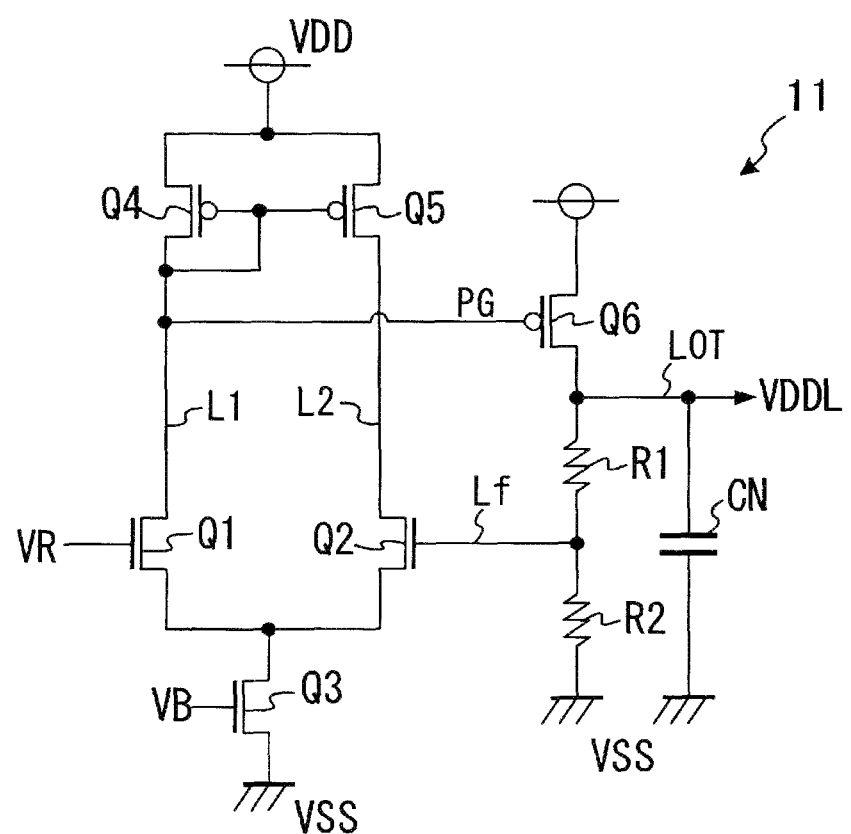
FIG. 3 is a circuit diagram showing an example of an internal configuration of a step-down circuit 11.

FIG. 3 is a circuit diagram showing an example of a step-down circuit 11. As shown in FIG. 3, the step-down circuit 11 includes n-channel MOS (metal-oxide-semiconductor) transistors Q1 to Q3, p-channel MOS transistors Q4 to Q6, a capacitor CN, and resistors R1 and R2.

Of the transistors Q1 and Q2 forming a differential pair, the gate terminal of Q1 has supplied thereto a reference voltage VR for setting the value of the step-down voltage VDDL. The reference voltage VR has a constant voltage value corresponding to the above-mentioned minimum voltage value. The gate terminal of the transistor Q2 has supplied thereto a divided voltage Vd formed by dividing the step-down voltage VDDL using the resistors R1 and R2.

$$Vd=(R2 \cdot VDDL)/(R1+R2)$$

The source terminals of the transistors Q1 and Q2 are connected to the drain terminal of the transistor Q3. A constant bias voltage VB is supplied to the gate terminal of the transistor Q3, and ground potential VSS (0V, for example) is applied to the source terminal thereof. The drain terminal of the transistor Q1 is connected through the line L1 to the drain terminal and gate terminal of the transistor Q4, the gate terminal of the transistor Q5, and the gate terminal of the transistor Q6. The source terminals of the transistors Q4 and Q5 have applied thereto a power supply voltage VDD. The drain terminal of the transistor Q5 is connected through the line L2 to the drain terminal of the transistor Q2. The power supply voltage VDD is supplied to the source terminal of the transistor Q6, and the drain terminal is connected through an output line LOT to a first terminal of the resistor R1 and a first terminal of the capacitor CN. The second terminal of the resistor R1 is connected through a feedback line Lf to a first terminal of the resistor R2 and the gate terminal of the transistor Q2. The ground potential VSS is applied to the second terminals of the resistor R2 and the capacitor CN. The transistor Q1 of the step-down circuit 11 causes a current corresponding in value to the reference voltage VR to flow through the line L1. At this time, the transistor Q6 sends a drain current to the output line LOT such that the voltage of the output line LOT becomes equal to the reference voltage VR, on the basis of the voltage PG of the line L1.

By the above configuration, the step-down circuit 11 steps down the power supply voltage VDD, generates a step-down voltage VDDL having a constant value lower than the value of the power supply voltage VDD (such as the minimum value in the range of the power supply voltage VDD), and supplies this step-down voltage to the booster circuit 12.

Figure 4:
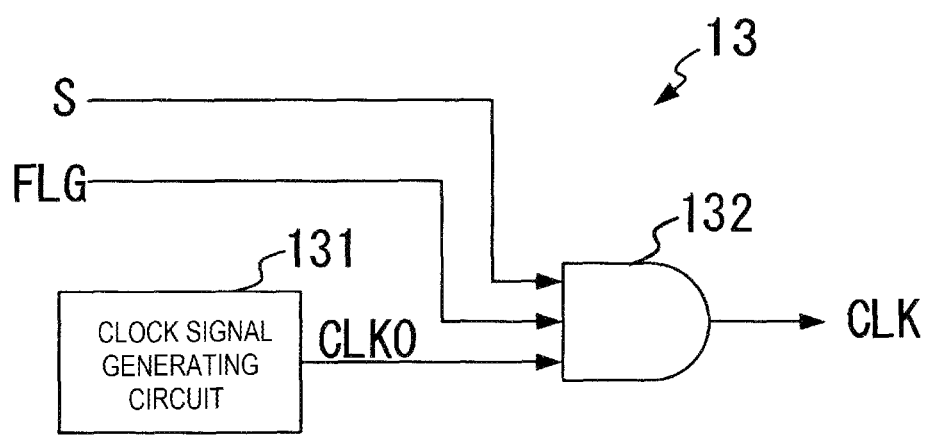
FIG. 4 is a circuit diagram showing an example of an internal configuration of a control circuit 13.

The control circuit 13 shown in FIG. 2 has a clock signal generating circuit 131 and an AND gate 132 as shown in FIG. 4, for example.

Figure 5:
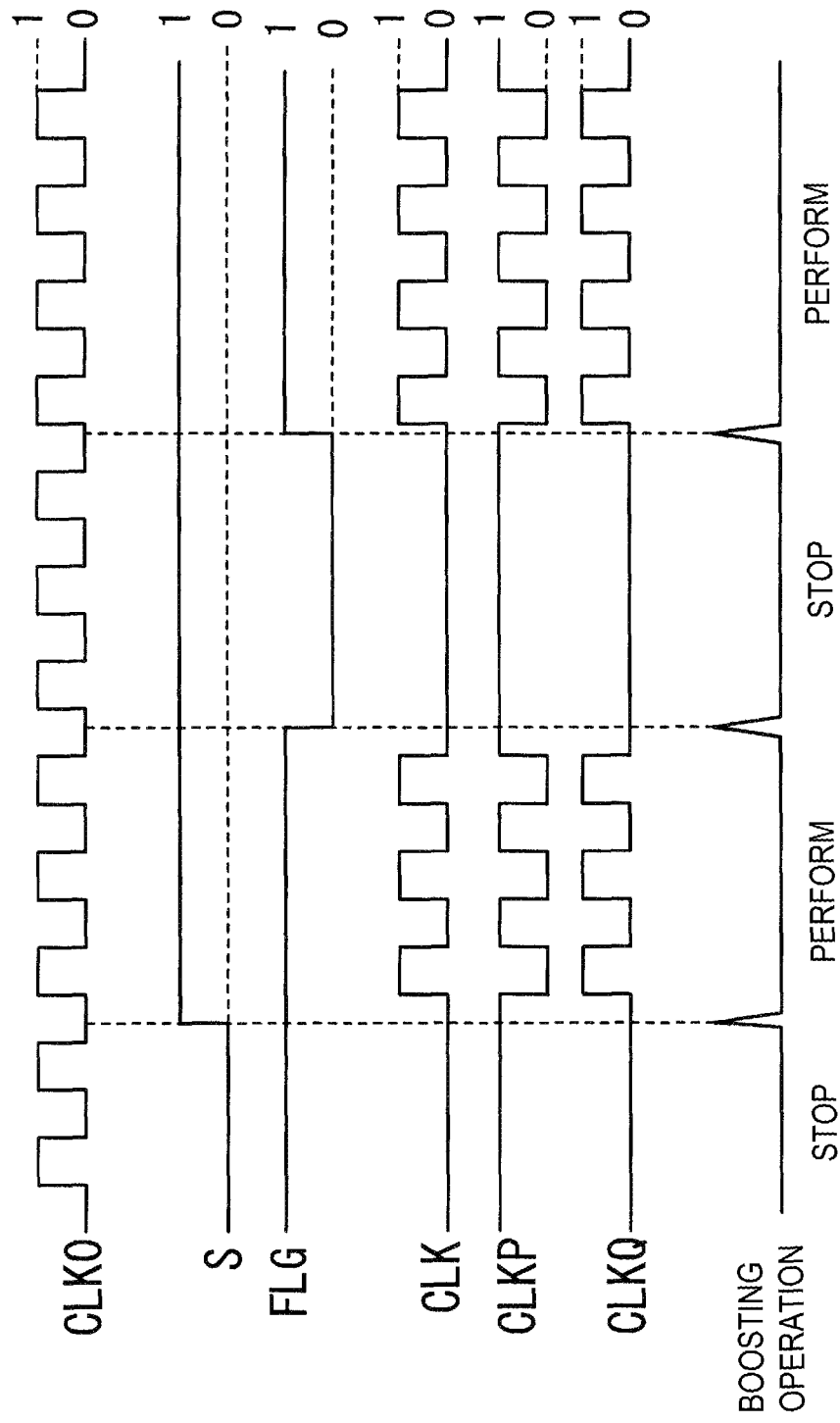
FIG. 5 is a time chart showing an example of an internal operation in the voltage supply circuit 10.

The clock signal generating circuit 131 generates a clock signal CLK0 that repeatedly alternates between a state corresponding to a logic level of 1 and a state corresponding to a logic level of 0 as shown in FIG. 5, and supplies the clock signal to the AND gate 132. If a flag signal FLG supplied from the voltage detection circuit 15 and the boost control signal S supplied from the memory control unit 103 are both at a logic level of 1 as shown in FIG. 5, the AND gate 132 supplies the clock signal CLK0 as is to the booster circuit 12 as the clock signal CLK. However, if at least one of the boost control signal S and the flag signal FLG is at a logic level of 0, then the AND gate 132 sets the clock signal CLK at a constant logic level of 0, and in effect stops the generation of the clock signal CLK.

The booster circuit 12 boosts the step-down voltage VDDL and generates an output voltage VPP having a higher value than the power supply voltage VDD.

Figure 6:
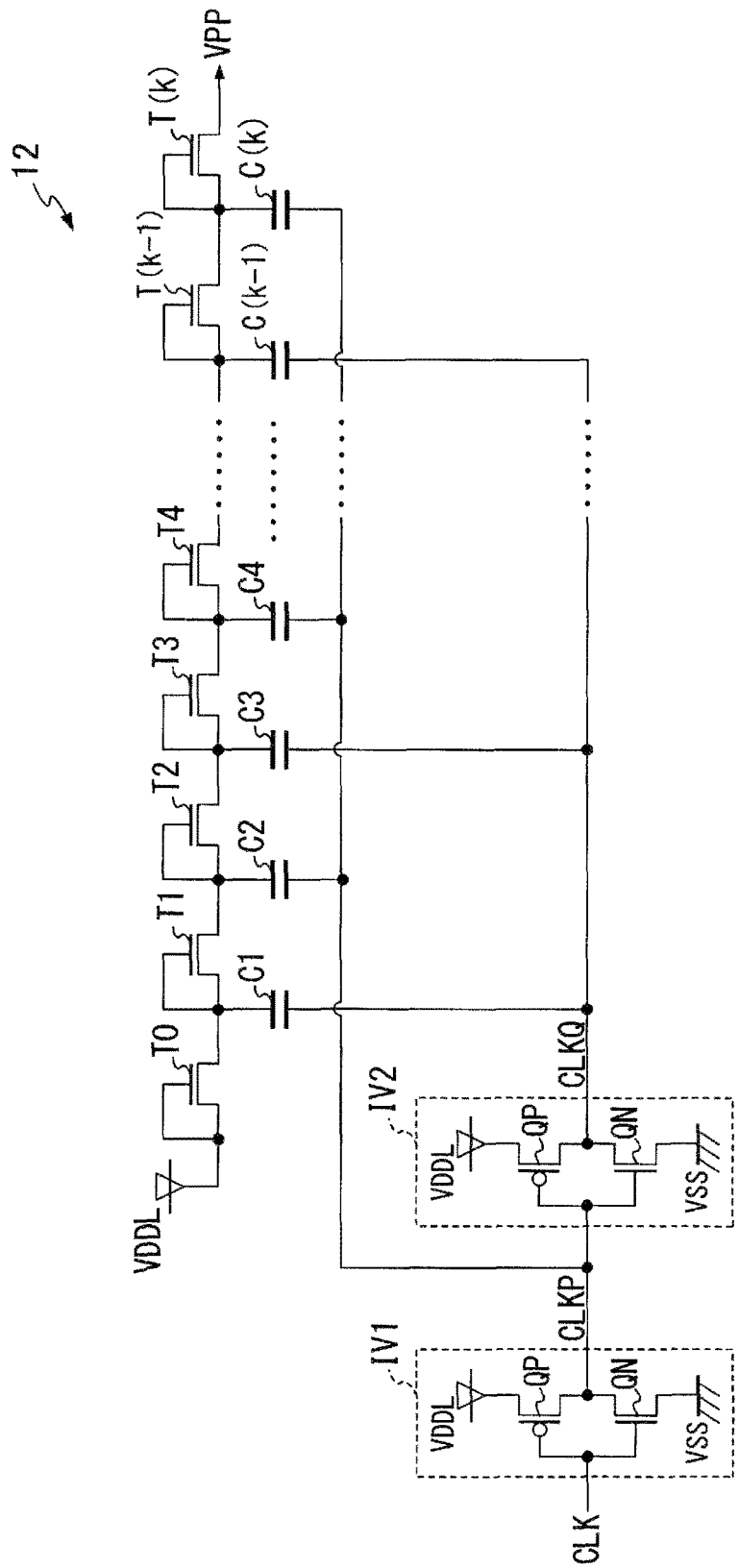
FIG. 6 is a circuit diagram showing an example of an internal configuration of a booster circuit 12.

FIG. 6 is a circuit diagram showing an example of a booster circuit 12. As shown in FIG. 6, the booster circuit 12 includes n-channel MOS transistors T0, T1, T2, . . . T(k) (k being an integer of 2 or greater) in a cascade arrangement, capacitors C1 to C(k), and inverters IV1 and IV2. In each of the transistors T0 to T(k), the gate terminal and the source terminal are connected to each other. The step-down voltage VDDL is applied to the source terminal of the transistor T0 at the head of the transistors T0 to T(k), and the drain terminal of the transistor T0 is connected to the source terminal of the next transistor T1 and a first terminal of the capacitor C1. Also, the drain terminal of the transistor T1 is connected to the source terminal of the next transistor T2 and a first terminal of the capacitor C2. The drain terminal of the transistor T2 is connected to the source terminal of the next transistor T3 and a first terminal of the capacitor C3. In essence, the drain terminal of the transistor Tj (j being an integer of 0 to k−1) is connected to the source terminal of the next transistor T(j+1) and a first terminal of the capacitor C(j+1).

Of the capacitors C1 to C(k), the second terminal of each even-numbered capacitor has supplied thereto an inverse clock signal CLKP shown in FIG. 5, for example, in which the logic level of the clock signal CLK is inverted by the inverter IV1. The second terminal of each odd-numbered capacitor has supplied thereto a clock signal CLKQ shown in FIG. 5, for example, in which the logic level of the inverse clock signal CLKP is inverted by the inverter IV2.

The inverter IV1 includes a p-channel MOS transistor QP that receives at the source terminal thereof the step-down voltage VDDL, and an n-channel MOS transistor QN that receives at the source terminal thereof the ground potential VSS. The inverter IV1 receives the clock signal CLK at the gate terminals of the transistors QP and QN. The inverter IV1 generates the inverse clock signal CLKP having an amplitude corresponding to the step-down voltage VDD as a clock signal in which the logic level is the inverse of the clock signal CLK as shown in FIG. 5. The inverter IV1 supplies the inverse clock signal CLKP through the drain terminals of the transistors QP and QN to the second terminals of even-numbered capacitors among the capacitors C1 to C(k) and the inverter IV2. The inverter IV2 has a similar configuration to the inverter IV1, and includes a p-channel MOS transistor QP that receives at the source terminal thereof the step-down voltage VDDL, and an n-channel MOS transistor QN that receives at the source terminal thereof the ground potential VSS. The inverter IV2 receives the inverse clock signal CLKP at the gate terminals of the transistors QP and QN thereof, and generates a clock signal CLKQ having an amplitude corresponding to the step-down voltage VDD as a clock signal in which the logic level is the inverse of the inverse clock signal CLKP. The inverter IV2 supplies this clock signal CLKQ through the drain terminals of the transistors QP and QN to the second terminals of odd-numbered capacitors among the capacitors C1 to C(k).

In the configuration shown in FIG. 6, first, the transistor T0 as the voltage supply transistor supplies a voltage corresponding to the step-down voltage VDDL to the source terminal of the transistor T1. At this time, the capacitors C1 to C(k) boost the voltage of the source terminals and gate terminals of the odd-numbered transistors among the transistors T1 to T(k) in accordance with the clock signal CLKQ, and boost the voltage of the source terminals and gate terminals of the even-numbered transistors among the transistors T1 to T(k) in accordance with the inverse clock signal CLKP. In this manner, the odd-numbered transistors and the even-numbered transistors among the transistors T1 to T(k) operate alternately as described below.

That is, the following operations are performed alternately: an operation in which the odd-numbered transistors receive the voltage boosted by the capacitors connected to previous stage transistors, and then supply this voltage to the next stage transistors; and an operation in which the even-numbered transistors receive the voltage boosted by the capacitors connected to the previous stage transistors and then supply this voltage to the next stage transistors. Thus, the value of the step-down voltage VDDL supplied to the source terminal of the transistor T1 among the transistors T1 to T(k) in a cascade arrangement gradually increases as it passes through the transistors T2 to T(k). Then, the boosted output voltage VPP having the highest value is outputted from the drain terminal of the last stage transistor T(k). By changing the frequency of the clock signal CLK or the capacitance of the capacitors C1 to C(k), it is possible to control the boosting performance of the booster circuit 12. In other words, the higher the frequency of the clock signal CLK is, or the higher the capacitance of the capacitors C1 to C(k) is, the greater the increase in voltage per unit time in the booster circuit 12 is.

As shown in FIG. 2, the booster circuit 12 supplies the output voltage VPP to the output terminal 14 and the voltage detection circuit 15.

The voltage detection circuit 15 has a voltage-dividing circuit 151 including a resistor RA and a limiter LM, and a comparator 152. The resistor RA has a resistance r1, a first terminal of the resistor RA being connected to the output terminal 14, and the second terminal thereof being connected to a first terminal of the limiter LM. The ground potential VSS is applied to the second terminal of the limiter LM. The limiter LM is a variable resistor, for example, in which the resistance r2 changes according to the voltage adjustment signal CV. If a voltage adjustment signal CV to cause an increase in the set voltage for the output voltage VPP is supplied, the resistance r2 of the limiter LM decreases, whereas when a voltage adjustment signal CV to cause a decrease in the set voltage is supplied, the resistance r2 increases.

The voltage detection circuit 15 supplies to the inversion input terminal of the comparator 152 the following monitor voltage VMON in which the voltage of the output terminal 14, that is, the output voltage VPP is divided by the resistor RA and the limiter LM.

$$VMON=(VPP \cdot r2)/(r1+r2)$$

The non-inversion input terminal of the comparator 152 has applied thereto a reference voltage VREF to be the threshold to determine whether or not to perform a boosting operation. The comparator 152 performs a size comparison between the value of the monitor voltage VMON and the value of the reference voltage VREF. The comparator 152 supplies to the control circuit 13 the flag signal FLG, which has a logic level of 0 when the monitor voltage VMON is greater than or equal to the reference voltage VREF, and has a logic level of 1 when the monitor voltage VMON is less than the reference voltage VREF.

While the monitor voltage VMON is less than the reference voltage VREF, that is, while the flag signal FLG is at a logic level of 1, the control circuit 13 supplies to the booster circuit 12 a clock signal CLK that alternates between a logic level of 0 and a logic level of 1 as shown in FIG. 5. While the clock signal CLK is being supplied, the booster circuit 12 boosts the step-down voltage VDDL. On the other hand, while the monitor voltage VMON is greater than or equal to the reference voltage VREF, that is, while the flag signal FLG is at a logic level of 0, the control circuit 13 supplies to the booster circuit 12 a clock signal CLK that maintains a constant logic level of 0 as shown in FIG. 5. In this manner, the booster circuit 12 stops the boosting operation on the step-down voltage VDDL. Thus, during this period the step-down voltage VDDL gradually decreases.

By alternating between performing and stopping the boosting process by the booster circuit 12, the value of the output voltage VPP is narrowed to the desired set voltage value (including ripples) that is higher than the power supply voltage VDD.

Next, the relationship between the above-mentioned power supply voltage VDD and output voltage VPP, and ripples occurring in the output voltage VPP will be described while comparing the voltage supply circuit 10 shown in FIG. 2 with a voltage supply circuit 100 disclosed in Japanese Patent Application Laid-Open Publication No. 2008-305467.

Figure 7:
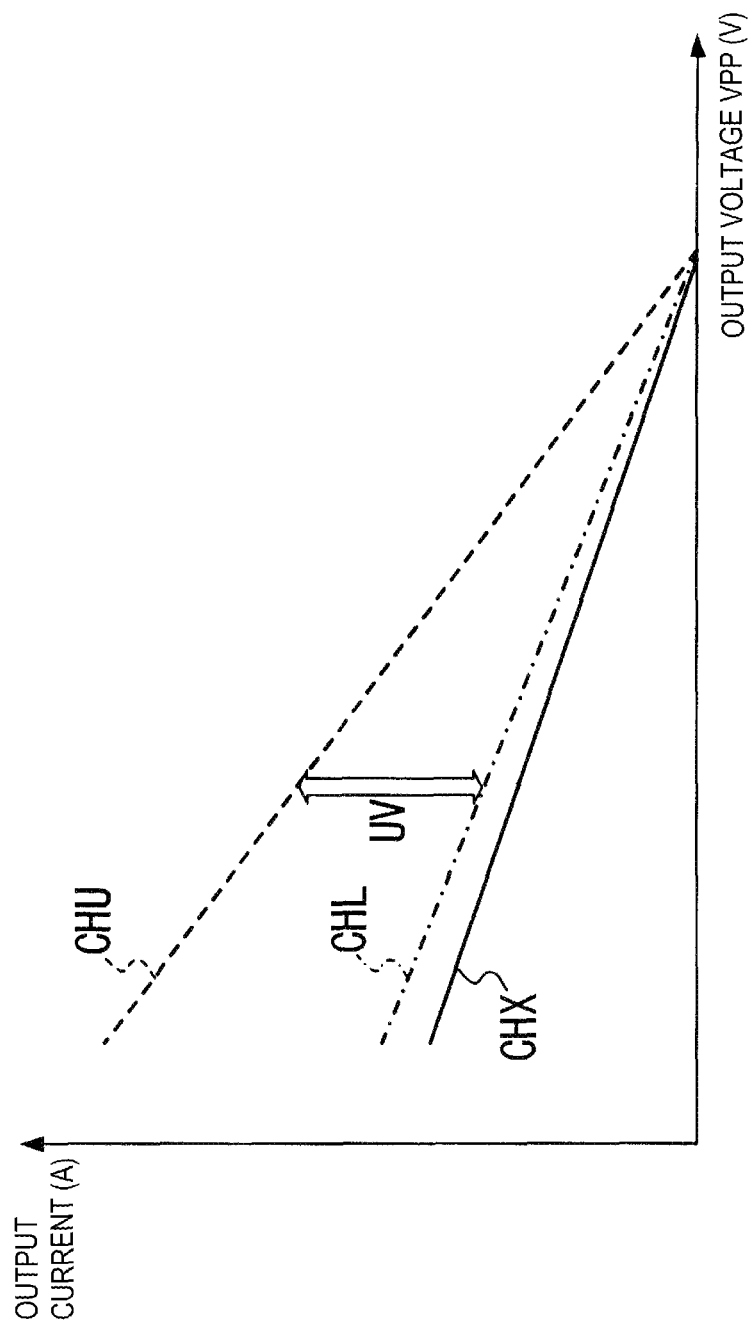
FIG. 7 is a voltage-current characteristic chart showing the relationship between an output voltage VPP and an output current.

FIG. 7 is a voltage (VPP)-current characteristic chart showing the relationship between the output voltage VPP and the output current.

In FIG. 7, the broken line indicates a voltage-current characteristic CHU for when a power supply voltage VDD having a relatively high first voltage value is supplied to the voltage supply circuit disclosed in Japanese Patent Application Laid-Open Publication No. 2008-305467, and the one-dot chain line indicates a voltage-current characteristic CHL for when a power supply voltage VDD having a second voltage value lower than the first voltage value is supplied to the voltage supply circuit disclosed in Japanese Patent Application Laid-Open Publication No. 2008-305467. In FIG. 7, the solid line indicates a voltage-current characteristic CHX of the booster circuit 12 of the voltage supply circuit 10 shown in FIG. 2.

Here, as shown in FIG. 7, the lower the output voltage VPP generated by the boosting operation of the booster circuit is, the greater the output current that can be outputted by the booster circuit is. In other words, the booster circuit can output more current, the lower the voltage set as the output voltage VPP is.

In the voltage supply circuit disclosed in Japanese Patent Application Laid-Open Publication No. 2008-305467, the booster circuit receives the power supply voltage VDD and performs a boosting process on the power supply voltage VDD. At this time, as shown in FIG. 7, when the value of the power supply voltage VDD received by the booster circuit is high (CHU), the output current is greater than when the value is low (CHL). Thus, as shown in FIG. 7, in the voltage supply circuit disclosed in Japanese Patent Application Laid-Open Publication No. 2008-305467, there is a difference UV in output currents depending on the value of the power supply voltage VDD supplied from outside.

On the other hand, in the voltage supply circuit 10 shown in FIG. 2, the booster circuit 12 receives not the power supply voltage VDD but rather the step-down voltage VDDL resulting from the step-down circuit 11 stepping down the value of the power supply voltage VDD, and then performs a boosting process on the step-down voltage VDDL. At this time, the step-down voltage VDDL is a constant voltage that is lower than the power supply voltage VDD and does not depend thereon.

Thus, according to the voltage supply circuit 10 shown in FIG. 2, as indicated by the voltage-current characteristic CHX of FIG. 7, the size of the output current corresponding to the value of the output voltage VPP is less than that of the booster circuit disclosed in Japanese Patent Application Laid-Open Publication No. 2008-305467 and is constant without being dependent on the value of the power supply voltage VDD.

Therefore, according to the voltage supply circuit 10 shown in FIG. 2, the output current can be made small regardless of the value of the power supply voltage VDD, and thus, it is possible to suppress the amplitude of ripples in the output voltage VPP, which increases along with the size of the output current.

Figure 8:
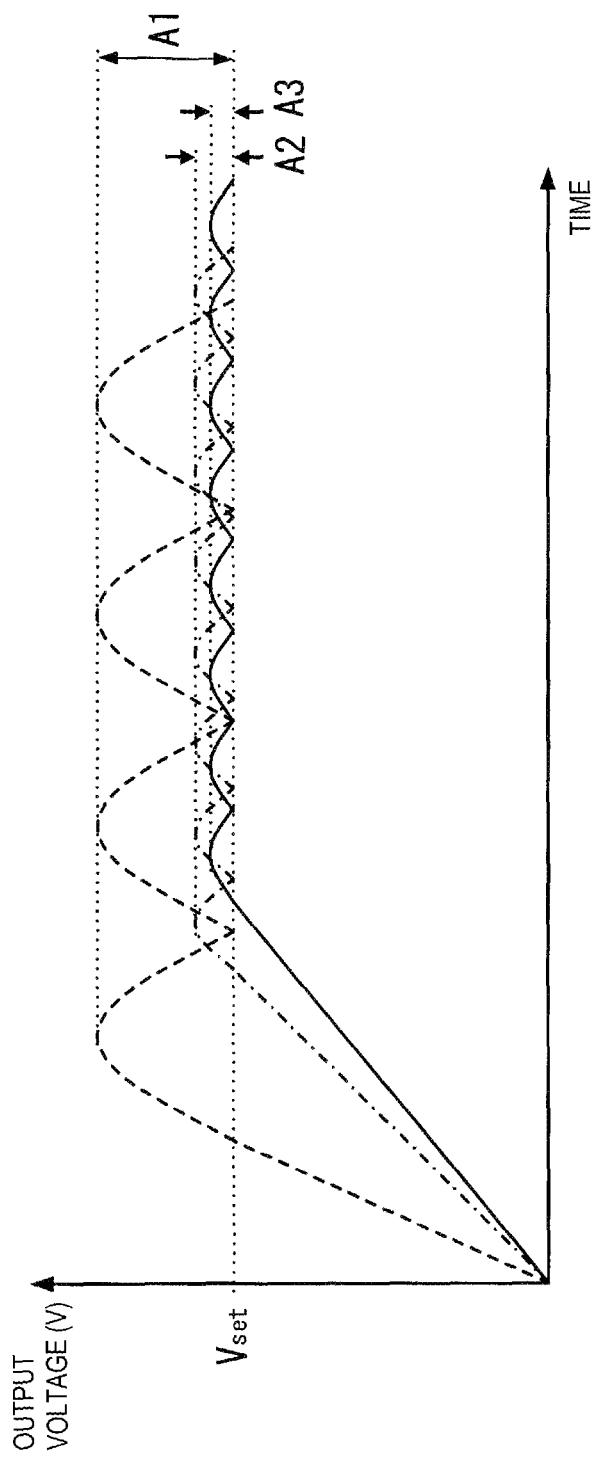
FIG. 8 is a waveform chart showing an example of an aspect of ripples generated in the output voltage VPP.

FIG. 8 is a waveform chart showing the form of ripples occurring in the output voltage VPP after the value of the output voltage VPP is boosted by the boosting operation of the booster circuit and reaches a desired set voltage $V_{set}$. In FIG. 8, the broken line indicates a waveform of the output voltage VPP generated when a power supply voltage VDD having a relatively high first voltage value is supplied to the voltage supply circuit disclosed in Japanese Patent Application Laid-Open Publication No. 2008-305467, and the one-dot chain line indicates a waveform of the output voltage VPP generated when a power supply voltage VDD having a second voltage value lower than the first voltage value is supplied to this voltage supply circuit. In FIG. 8, the solid line indicates a waveform of the output voltage VPP outputted from the voltage supply circuit 10 shown in FIG. 2.

In the voltage supply circuit disclosed in Japanese Patent Application Laid-Open Publication No. 2008-305467, the greater the value of the power supply voltage VDD is, the greater the output current is, and the rate of rise in the value of the output voltage VPP increases, and the amplitude of the ripples increases in proportion therewith. For example, as shown in FIG. 8, an amplitude A1 of ripples occurring in the output voltage VPP when a power supply voltage VDD having a relatively high value is supplied (indicated by the broken line), is greater than an amplitude A2 of ripples occurring in the output voltage VPP for when a power supply voltage VDD having a relatively low value is supplied (indicated by the one-dot chain line).

On the other hand, in the power supply voltage 10 shown in FIG. 2, the step-down voltage VDDL, which is fixed at the minimum value in the voltage range of the power supply voltage VDDL, is boosted to attain the output voltage VPP. Thus, as shown in FIG. 8, the amplitude of ripples occurring in the output voltage VPP generated in the voltage supply circuit 10 is less than both of the amplitudes A1 and A2 of ripples caused by the voltage supply circuit disclosed in Japanese Patent Application Laid-Open Publication No. 2008-305467, and is a constant amplitude A3 regardless of the value of the power supply voltage VDD.

Thus, according to the voltage supply circuit 10, it is possible to suppress the amplitude of ripples occurring in the output voltage when attaining an output voltage (VPP) having a desired set value attained by boosting the power supply voltage (VDD).

Therefore, when writing data to a NAND flash memory while incrementally increasing the value of the write voltage, it is possible to set the amount of increase in the voltage to a desired amount, enabling accurate data writing.

In the above embodiment, the voltage supply circuit 10 is described as being provided with a NAND flash memory, but the voltage supply circuit 10 may be provided with a semiconductor storage device such as a NOR electrically erasable programmable read-only memory (EEPROM), a DINOR EEPROM, or an AND EEPROM, or may be provided with a circuit or the like requiring a higher voltage than the power supply voltage VDD.

Also, in the voltage supply circuit 10 according to the embodiment, the step-down circuit 11 supplies to the booster circuit 12 a step-down voltage VDDL attained by stepping down the value of the power supply voltage VDD to the minimum value attainable as the power supply voltage, but the value of the step-down voltage VDDL may be lower than the minimum value attainable as the power supply voltage. In this manner, it is possible to attain an even smaller amplitude for the ripples than the amplitude A3 shown in FIG. 8

To summarize, at minimum, the voltage supply circuit should be provided with the following step-down circuit (11) and booster circuit (12) in order to generate an output voltage (VPP) on the basis of the power supply voltage (VDD). That is, the step-down circuit steps down the power supply voltage to generate a step-down voltage (VDDL) having a constant value lower than the value of the power supply voltage. The booster circuit generates as the output voltage a voltage having a higher value than that of the power supply voltage by boosting the step-down voltage.

What is claimed is:

1. A voltage supply circuit, comprising:
    a step-down circuit configured to receive a power supply voltage, and step down the power supply voltage to generate a step-down voltage having a constant value lower than a value of the power supply voltage;
    a booster circuit configured to boost the step-down voltage to generate an output voltage so as to suppress an amplitude of ripples in the output voltage, the output voltage having a value greater than the value of the power supply voltage, the booster circuit configured to output the output voltage to a column decoder to supply a corresponding write voltage to a memory cell array; and
    a control circuit configured to control turning-on and turning-off of the booster circuit based on each of the output voltage, a selection signal from a memory control unit, and a predetermined clock signal.

2. The voltage supply circuit according to claim 1, wherein the booster circuit includes:
    a plurality of transistors connected in cascade, each transistor having a drain terminal, a gate terminal and a source terminal connected to each other, a drain voltage from the drain terminal of a last one of the transistors being used as the output voltage;
    a voltage supply transistor configured to supply the step-down voltage to the source terminal of a first one of the transistors; and
    a plurality of capacitors respectively connected to the source terminals of the plurality of transistors, the plurality of capacitors being configured to
        boost a gate-source voltage of each of odd-numbered transistors among the plurality of transistors in accordance with a clock signal having an amplitude corresponding to the step-down voltage, and
        boost a gate-source voltage of each of even-numbered transistors among the plurality of transistors in accordance with an inverse clock signal obtained by inverting a phase of the clock signal.

3. The voltage supply circuit according to claim 1, wherein
    the value of the power supply voltage is in a voltage range of a prescribed minimum voltage value to a prescribed maximum voltage value, and
    the constant voltage of the step-down voltage is less than or equal to the minimum voltage value.

4. The voltage supply circuit according to claim 3, wherein the booster circuit includes:
    a plurality of transistors connected in cascade, each transistor having a drain terminal, a gate terminal and a source terminal connected to each other, a drain voltage from the drain terminal of a last one of the transistors being used as the output voltage;

a voltage supply transistor configured to supply the step-down voltage to the source terminal of a first one of the transistors; and a plurality of capacitors respectively connected to the source terminals of the plurality of transistors, the plurality of capacitors being configured to boost a gate-source voltage of each of odd-numbered transistors among the plurality of transistors in accordance with a clock signal having an amplitude corresponding to the step-down voltage, and boost a gate-source voltage of each of even-numbered transistors among the plurality of transistors in accordance with an inverse clock signal obtained by inverting a phase of the clock signal.

5. The voltage supply circuit according to claim 3,
a wherein the control circuit is configured to
generate the clock signal in which a logic level of 0 and a logic level of 1 alternate when the value of the output voltage is less than a predetermined reference voltage, and stop generation of the clock signal when the value of the output voltage is greater than or equal to the predetermined reference voltage.

6. A semiconductor storage device, comprising:
a memory cell array including a plurality of memory cells;
a memory driving unit configured to supply a voltage for writing to the memory cell array in a writing period; and a voltage supply circuit configured to generate the voltage for writing from a power supply voltage and supply the voltage for writing to the memory driving unit, the voltage supply circuit including a step-down circuit configured to receive the power supply voltage, and step down the power supply voltage to generate a step-down voltage having a constant value lower than a value of the power supply voltage; and a booster circuit configured to boost the step-down voltage to generate the voltage for writing so as to suppress an amplitude of ripples in the output voltage, the voltage for writing having a value greater than the value of the power supply voltage, the booster circuit configured to output the output voltage to a column decoder to supply the voltage for writing to the memory cell array; and a control circuit configured to control turning-on and turning-off of the booster circuit based on each of the output voltage, a selection signal from a memory control unit, and a predetermined clock signal.

7. The semiconductor storage device according to claim 6, wherein the booster circuit includes:
a plurality of transistors connected in cascade, each transistor having a drain terminal, and a source and a gate terminal connected to each other, a drain voltage from the drain terminal of a last one of the transistors being used as the output voltage;

a voltage supply transistor configured to supply the step-down voltage to the source terminal of a first one of the transistors; and a plurality of capacitors respectively connected to the source terminals of the plurality of transistors, the plurality of capacitors being configured to boost a gate-source voltage of each of odd-numbered transistors among the plurality of transistors in accordance with a clock signal having an amplitude corresponding to the step-down voltage, and boost a gate-source voltage of each of even-numbered transistors among the plurality of transistors in accordance with an inverse clock signal obtained by inverting a phase of the clock signal.

8. The semiconductor storage device according to claim 6, wherein
the value of the power supply voltage is in a voltage range of a prescribed minimum voltage value to a prescribed maximum voltage value, and the constant voltage of the step-down voltage is less than or equal to the minimum voltage value.

9. The semiconductor storage device according to claim 8, wherein the booster circuit includes:
a plurality of transistors connected in cascade, each transistor having a drain terminal, and a source and a gate terminal connected to each other, a drain voltage from the drain terminal of a last one of the transistors being used as the output voltage;

a voltage supply transistor configured to supply the step-down voltage to the source terminal of a first one of the transistors; and a plurality of capacitors respectively connected to the source terminals of the plurality of transistors, the plurality of capacitors being configured to boost a gate-source voltage of each of odd-numbered transistors among the plurality of transistors in accordance with a clock signal having an amplitude corresponding to the step-down voltage, and boost a gate-source voltage of each of even-numbered transistors among the plurality of transistors in accordance with an inverse clock signal obtained by inverting a phase of the clock signal.

10. The semiconductor storage device according to claim 8, wherein the control circuit is configured to
generate the clock signal in which a logic level of 0 and a logic level of 1 alternate when a value of the output voltage is less than a predetermined reference voltage, and stop generation of the clock signal when the value of the output voltage is greater than or equal to the predetermined reference voltage.

11. The voltage supply circuit according to claim 1, further comprising a voltage detection circuit configured to receive the output voltage, to compare the output voltage to a reference voltage, and to output a flag signal to the control circuit, the flag signal having a voltage state that is based on the comparison of the output voltage to the reference voltage.

* * * * *